United States Patent [19]

Taguchi

[11] Patent Number: 5,001,108
[45] Date of Patent: Mar. 19, 1991

[54] SEMICONDUCTOR DEVICE HAVING A SUPERCONDUCTIVE WIRING

[75] Inventor: Masao Taguchi, Sagamihara, Japan

[73] Assignee: Fujitsu Limited, Kawasaki, Japan

[21] Appl. No.: 207,628

[22] Filed: Jun. 16, 1988

[30] Foreign Application Priority Data

Jun. 18, 1987 [JP] Japan ................... 62-150248

[51] Int. Cl.⁵ .................. H01L 23/00; H01L 39/00
[52] U.S. Cl. ............................ 505/1; 357/71; 357/4; 357/22; 357/55; 357/61; 333/99 S
[58] Field of Search ............. 505/706, 920, 921, 704; 357/22, 4, 55, 58, 61, 69, 71; 333/246, 247, 99 S

[56] References Cited

U.S. PATENT DOCUMENTS

| | | | |
|---|---|---|---|
| 4,531,982 | 7/1985 | Dubots | 575/920 |
| 4,593,301 | 6/1986 | Inata et al. | 357/55 X |
| 4,837,609 | 6/1989 | Gurvitch et al. | 357/71 |

FOREIGN PATENT DOCUMENTS

| | | | |
|---|---|---|---|
| 0299163 | 5/1988 | European Pat. Off. | |
| 0006882 | 1/1986 | Japan | 357/55 |
| 63-308975 | 12/1988 | Japan | |
| 0111349 | 1/1989 | Japan | |

OTHER PUBLICATIONS

"Anisotropic Properties of Superconducting Single-Crystal $(La_{1-x}SR_x)_2 CuO_4$", Hidaka et al., J. Appl. Phys., vol. 4, Apr. 1987, pp. L377-L379.

High Tc Superconductivity of La-Ba-Cu Oxides. III--Electrical Resistivity Measurement, Uchida et al., 1/24/86.

Mutsuko Miyake, "Patent Abstracts of Japan", vol. 11, No. 33, Jan. 30, 1987, Japan, pp. 329-333.

Masaaki Aoki, "Patent Abstracts of Japan", vol. 9, No. 321, Dec. 17, 1985, Japan, pp. 53-55.

Primary Examiner—Rolf Hille
Assistant Examiner—Mahshid Saadat
Attorney, Agent, or Firm—Staas & Halsey

[57] ABSTRACT

Connecting a superconductive material wiring layer to an electrode formed of normal metals (i.e. non-superconductive metals, such as aluminum), and connecting a part of a semiconductor region to the normal metal. The normal metal can contact the superconductive wiring layer via a barrier metal, such as TiN, at least at a side wall of the superconductive wiring layer which is essentially orthogonal to the layer wiring. Accordingly, even when the wiring layer is anisotropically superconductive mainly in a direction parallel to the plane of deposition, the superconductive property can be fully realized. The inventive structure prevents copper atoms in the superconductive material and silicon atoms in the semiconductor region of the IC from producing an undesirable alloy. This improves reliability of the IC operation, i.e. the semiconductor material as well as the superconductive material is not deteriorated.

19 Claims, 9 Drawing Sheets

SEMICONDUCTOR DEVICE HAVING A SUPERCONDUCTIVE WIRING

BACKGROUND OF THE INVENTION

This invention relates to a semiconductor device whose wiring layer is formed of a superconductive material.

Materials employed as electrodes or wirings of semiconductor devices, such as integrated circuits (hereinafter "ICs"), generally comprise a metal, such as aluminum, or a semiconductor material, such as polycrystalline silicon. In today's integrated circuits, it is essential to improve the operating speed and integration density of the ICs. To enhance integration density, the IC wiring must be as narrow as possible. However, even if an electrically good conductive metal is used for the wiring layer, wirings in the sub-micron meter range have increased electrical resistance. This causes time delays and degrades the signal propagation in the IC.

Recently, research and development of an electrically superconductive (hereinafter "superconductive") material has yielded promising ceramic materials. These materials have zero electrical resistance below a certain temperature, such as 77 K, the boiling temperature of the liquid nitrogen. Superconductive ceramic materials with good electrical characteristics even at this relatively high temperature have been reported as comprising yttrium (Y), barium (Ba), copper (Cu), and oxygen, as well as a compound comprising barium, lanthanum (La), copper, and oxygen. These compounds are first formed as a thin film layer which is then heat-treated in an oxygen-containing atmosphere so that the material of the layer becomes superconductive. Using this superconductive ceramic material as the wiring layer for an IC can make the electrical resistance of the wiring zero. Thus, signals or a power source voltage can reach its destination without delay or degradation of the signal. Use of a superconductive material is particularly desirable in a high electron mobility transistor (hereinafter "HEMT") because of their remarkably high speed operation at temperatures below 77 K.

However, a superconductive ceramic material cannot simply replace a metal layer Wiring formed of a normal conductive material; that is, a material that is not a superconductive material. Such non-superconductive materials are hereinafter collectively referred to as a normal metal, such as aluminum or gold. There are several problems preventing use of the superconductive ceramic materials, as discussed below.

(1) In the region where the superconductive ceramic material directly contacts a semiconductor material, atoms in the superconductive material reacts with atoms in the semiconductor material. Particularly, copper, which is abundant in the superconductive material, easily forms an eutectic alloy with silicon (Si) the semiconductor silicon substrate, and penetrates further into the silicon substrate.

(1-1) When copper atoms reach a p-n junction, they cause the breakdown voltage of the p-n junction to be lowered, the reverse current of the p-n junction to be increased, and the current gain of a bipolar transistor to be decreased. These undesirable side effects result from the shortened lifetime of carriers in the p-n junction, or because of carrier generation and recombination centers causing noise generation in the p-n junction.

(1-2) When the copper atoms reach a MOS (metal oxide semiconductor) structure, they lower the dielectric breakdown voltage of the structure.

(1-3) Ohmic contact is not always accomplished between the superconductive wiring layer and the semiconductor region. Thus, the junction has a rectifier characteristic or; that is, a high electrical resistance.

(2) The superconductive ceramic materials reported in public are mostly bulk type materials; that is, they have a random layer structure or electrically isotropic characteristics. However, when a superconductive material is formed in a thin film that is needed to fabricate a wiring layer for an LSI (large scale IC) by means of widely used epitaxial growth techniques (e.g. a molecular beam epitaxy (MBE) or a reactive sputtering method), the atoms or molecules are deposited in a particular orientation, i.e. the layered structure becomes anisotropic. With this particular orientation of the atoms/molecules, the superconductive material forms a layered structure extending parallel to the substrate's surface plane, for example, (1 1 0) on which the wiring layer is deposited also in the plane (1 1 0) (FIG. 8(a)). The layer is superconductive mainly in the direction of the substrate's surface plane direction (1 1 0), which is referred to hereinafter as horizontal direction. In other words, the electrical resistance in an orthogonal direction to the horizontal direction, i.e., across the thickness of the layers as indicated by an arrow B in FIG. 8(a), does not become zero as discussed above. In the strict sense of the word, the critical value of the superconductive current, in the thickness direction (arrow B) is much less than that in the horizontal direction.

Figure 1:
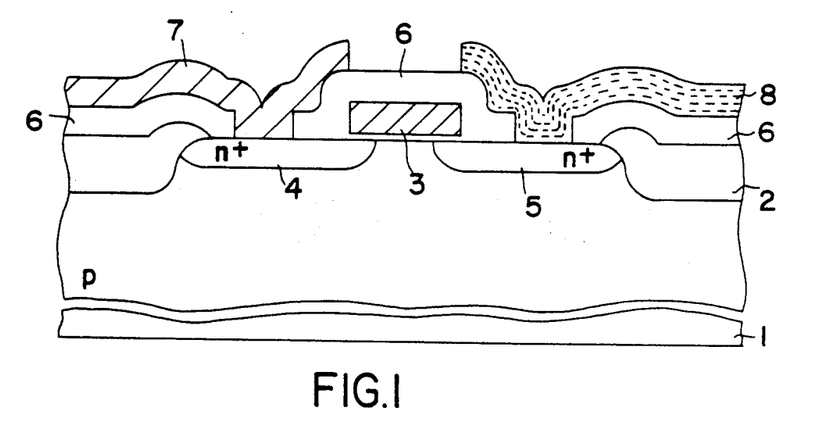
FIG. 1 is a schematic, cross-sectional view of a semiconductor device having a superconductive layer wiring thereon.

Referring to practical examples, the above-described problems are hereinafter explained. FIG. 1 is a cross-sectional view of a sample general MOS transistor in which an electrode and wiring of the drain are formed of a superconductive ceramic material. The numeral 1 denotes a p-type silicon substrate; the numeral 2 denotes a silicon dioxide ($SiO_2$) field isolation layer; the numeral 3 denotes a polycrystalline silicon gate electrode; the numeral 4 denotes an n+ type source region, the numeral 5 denotes an n+ type drain region; the numeral 6 denotes a $SiO_2$ inter-layer insulation film; the numeral 7 denotes an aluminum source electrode; and the numeral 8 denotes a superconductive ceramic material electrode/wiring. In this sample, direct contact between the drain electrode/wiring layer 8 and the n+ type drain region 5 not only produces a high electrical contact resistance negating the beneficial advantage of using a superconductive material, but also produces an alloy of the materials that causes junction leakage.

Figure 2:
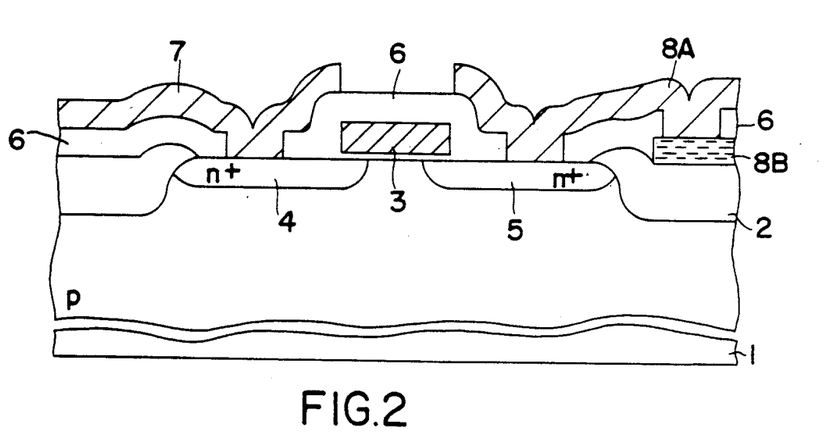
FIG. 2 is a schematic, cross-sectional view of another semiconductor device having a superconductive layer wiring thereon.

FIG. 2 is a cross-sectional view of another sample MOS transistor with a typical aluminum drain electrode that connects the drain region to a superconductive ceramic material drain wiring. In FIG. 2, the same numerals denote the same parts or parts having the same function as those in FIG. 1. The numeral 8A denotes a drain electrode, and the numeral 8B denotes a drain wiring. In this sample, the reaction of the superconductive ceramic material with the n+ type drain region is prevented because the superconductive material 8B does not directly contact the n+ type silicon drain region 5. Furthermore, if the drain wiring 8B is anisotropic, the contact resistance increases because the aluminum electrode 8A contacts the superconductive wiring layer 8B at its horizontal surface where the superconductive property is not fully realized. Accordingly, the beneficial advantages of employing a superconductive ceramic material cannot be achieved.

SUMMARY OF THE INVENTION

It is an object of the invention to provide a semiconductor device structure which prevents a superconductive wiring layer from forming an undesirable alloy with a semiconductor region or mutual diffusion of the atoms of both compositions so that the deterioration of the semiconductor region as well as the superconductive material is prevented.

It is another object of the invention to provide a semiconductor device structure in which the contact resistance between a superconductive wiring layer and a semiconductor region is ohmic and adequately low even when the superconductive layer is anisotropically superconductive mainly in a direction parallel to a plane of the layer deposition.

It is still another object of the invention to provide a metal semiconductor FET (MESFET), for example, a HEMT structure in which a gold-germanium alloy electrode designed not to cause excessive alloying with GaAs or AlGaAs layers during high temperature heat processing for forming a superconductive wiring, so as to achieve desirable performance and reliability in operation.

To achieve the above and other objects of the present invention, an electrically non-superconductive electrode, such as aluminum or gold-germanium alloy, is provided on a semiconductor region. The electrode contacts an anisotropically superconductive wiring layer mainly in a direction parallel to the plane of the layer's deposition on an insulation layer, and contacts at least at a side wall of the anisotropically superconductive wiring layer, which is essentially orthogonal to the plane of the wiring layer. This structure provides ohmic contact resistance that is essentially zero between the superconductive layer and the electrode, and prevents copper atoms in the superconductive material from reacting with silicon atoms in the semiconductor region. As a result, alloying of these materials is prevented as is deterioration of the semiconductor region and the superconductive material.

The above-mentioned features and advantages of the present invention, together with other objects and advantages, which will become apparent and more fully described hereinafter, with reference to the accompanying drawings which form a part hereof, wherein like numerals refer to like parts throughout.

DESCRIPTION OF THE PREFERRED EMBODIMENTS

Figure 3:
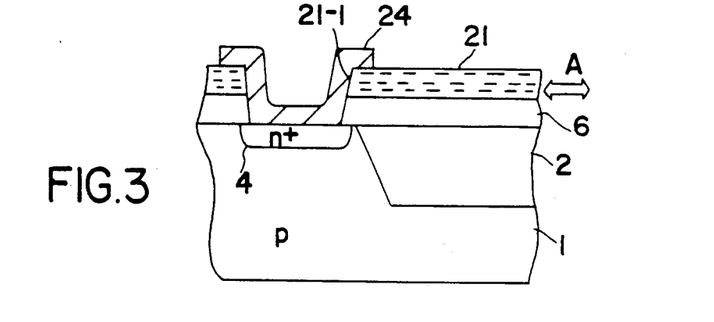
FIG. 3 is a schematic, cross-sectional view of a semiconductor device embodying the principle of the present invention.

FIG. 3 is a schematic, cross-sectional view of a semiconductor device embodying the principle of the present invention. An inter-layer insulation film 6 is formed on a semiconductor substrate 1, having a semiconductor region 4 and a field isolation region 2. A superconductive material wiring layer 21 is formed on the insulation film 6. A normal metal electrode 23 comprising, for example, aluminum is formed on the semiconductor region 4 so as to electrically connect the semiconductor region 4 with the superconductive wiring layer 21. This electrical connection is at least through a plane 21-1 which is essentially orthogonal to the plane of the wiring layer 21. It is in this plane (i.e. the direction indicated by the arrow mark A), that the wiring layer 21 is orthogonally superconductive.

A preferred embodiment of the present invention is described with reference to FIGS. 4 and 5. FIG. 4 is a schematic, partial cross-sectional view of a bipolar semiconductor device. In the FIG. 4 device, a collector wiring and an emitter wiring are formed of a superconductive ceramic material, while a base wiring is formed of normal metal.

Figure 4A:
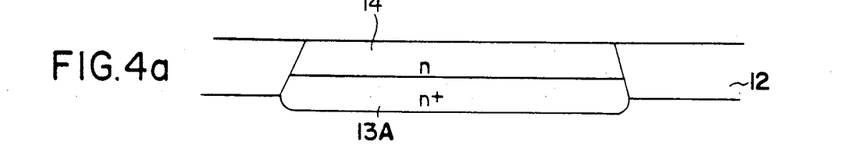
FIGS. 4(a) through 4(h) are schematic, partial cross-sectional side view of an embodiment of a bipolar transistor according to the present invention during various fabrication steps.
Figure 4B:
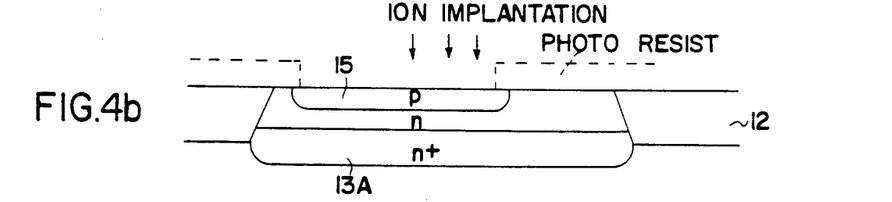
Figure 4C:
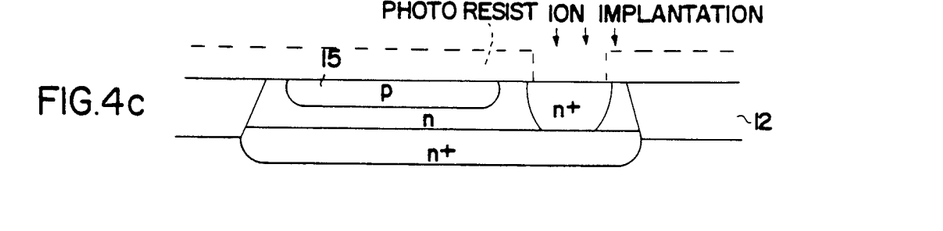
Figure 4D:
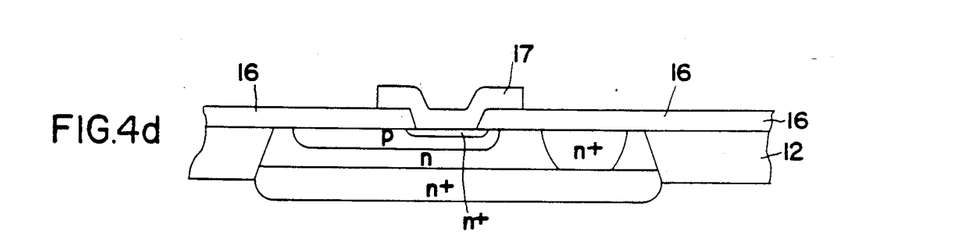
Figure 4E:
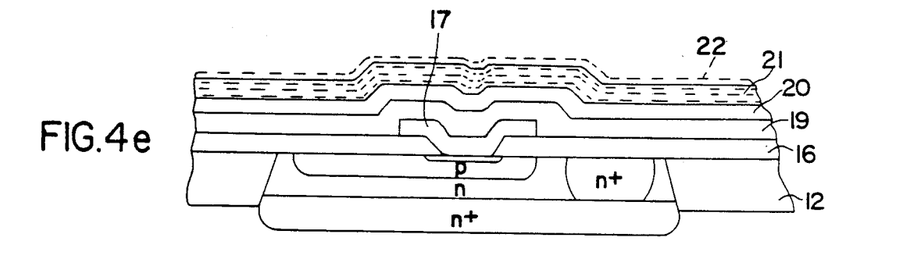
Figure 4F:
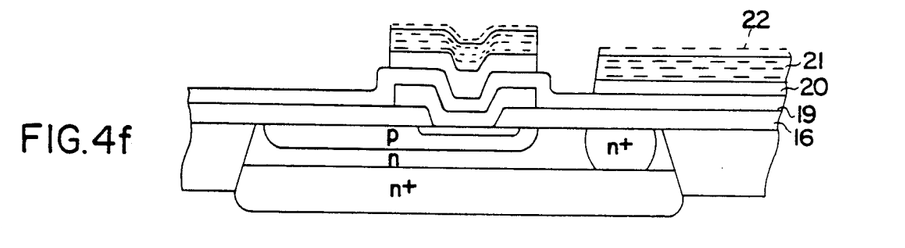
Figure 4G:
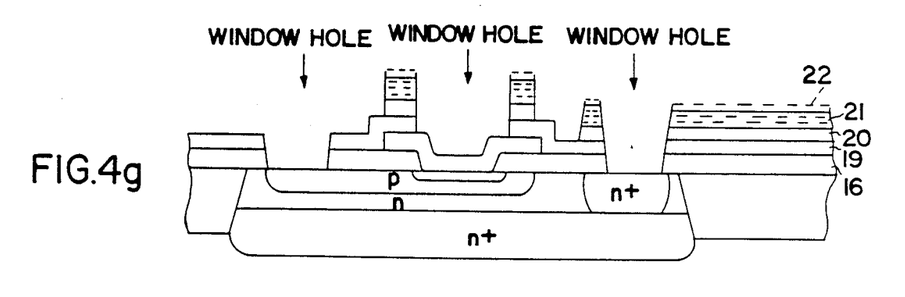
Figure 4H:
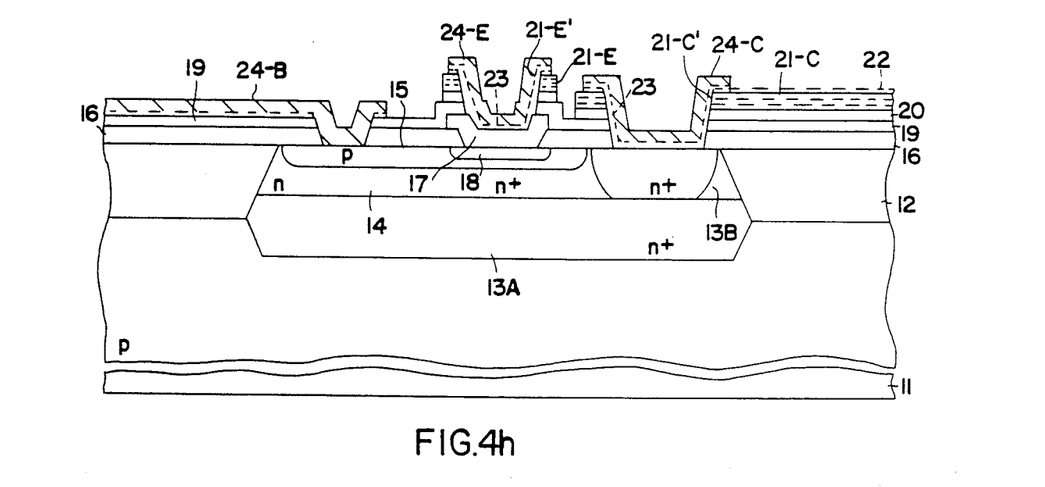
Figure 5:
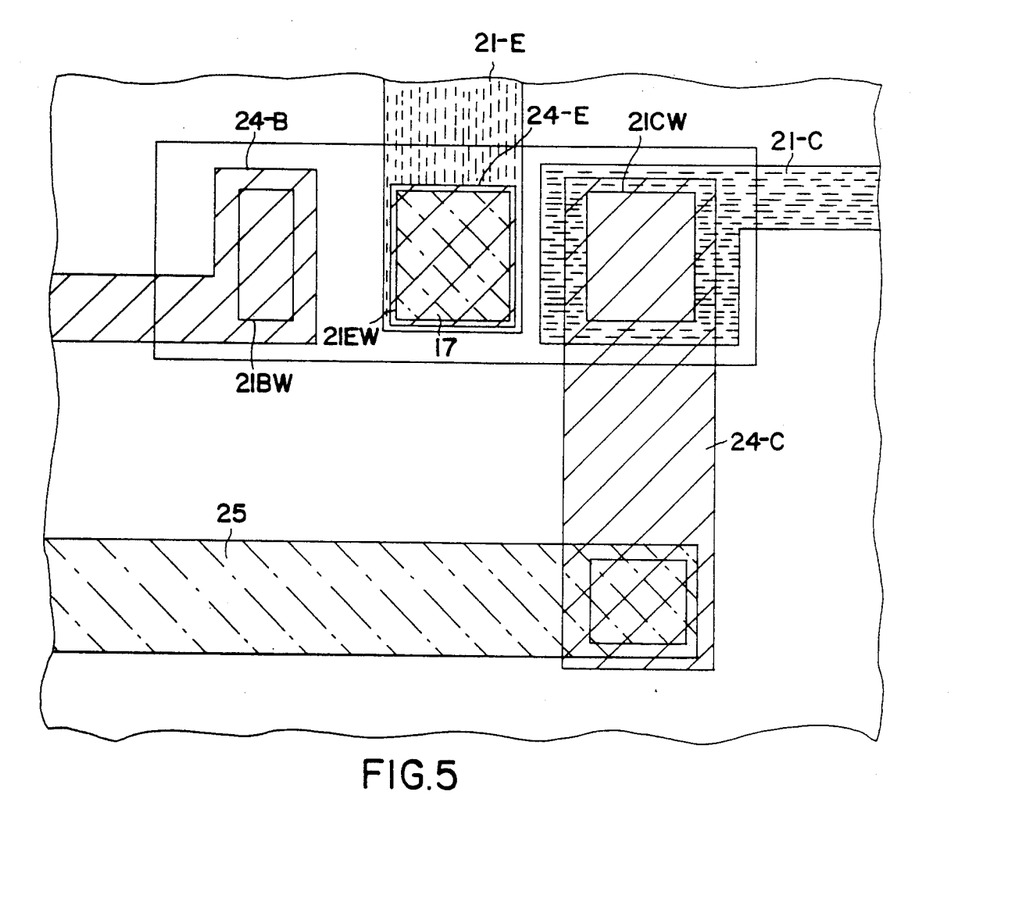
FIG. 5 is a schematic, plan view of the electrodes and the wiring layer of the embodiment of FIG. 4.

FIG. 5 is a schematic, plan view of the electrodes and the wiring layer of the embodiment of FIG. 4. In FIGS. 4 and 5, numeral 11 denotes a p-type silicon substrate; numeral 12 denotes a field isolation layer; numeral 13A denotes a n+ type buried layer; numeral 13B denotes an n+ type collector contact region; numeral 14 denotes a collector layer of an n-type silicon; numeral 15 denotes a base layer of a p-type silicon; numeral 16 denotes a first inter-layer insulation film comprising, for example, $SiO_2$; numeral 17 denotes a polycrystalline silicon film containing an impurity; numeral 18 denotes an n+ type emitter region; numeral 19 denotes a second inter-layer insulating film comprising, for example, $SiO_2$; numeral 20 denotes a third insulating film comprising, for example, MgO (magnesium oxide), $SrTiO_3$ (strontium titanate) or $Al_2O_3$ (aluminum oxide). The composition of the third insulating layer provides a good affinity between the lattices of the superconductive material and the $SiO_2$ film 19. The good affinity of the lattices is essential for maintaining superconductivity. Also in the figures, numerals 21-C and 21-E denote a patterned, superconductive material collector wiring layer and emitter wiring layer respectively; numeral 21CW (FIG. 5) denotes an electrode-contact window hole provided through the superconductive wiring layer 21-C; numeral 21EW (FIG. 5) denotes an electrode-contact window hole provided through the superconductive wiring layer 21-E; numeral 22 denotes a passivation film comprising, for example, a TEFLON-like polymer material; numeral 23 denotes a barrier metal layer comprising, for example, TiN (titanium nitride) or titanium (Ti) which is electrically conductive and prevents aluminum atoms from forming an alloy with the silicon atoms in the semiconductor regions 13B and 18, as well as in the $SiO_2$ films 19 and 20; numeral 24-B denotes a base electrode/wiring layer comprising a normal metal, such as aluminum, gold or tungsten (W); numeral 24-E denotes an emitter electrode comprising a normal metal, such as aluminum, gold or tungsten; numeral 24-C denotes a collector electrode comprising a normal metal, such as aluminum, gold or tungsten; and the numeral 25 denotes a polycrystalline silicon resistor.

A fabrication process for the semiconductor device shown in FIGS. 4 and 5 is as follows. The individual steps of the process are widely known process steps.

(1) Forming the n+ type buried layer 13A in the silicon substrate 11 and n-type collector epitaxial layer 14 with a general bipolar semiconductor fabrication technique. Isolation region 12 may be formed using general bipolar process techniques. FIG. 4(a).

(2) Forming p-type silicon base layer 15 thereon. The formation of the p-type silicon base layer 15 may be carried out by a photolithographic step and ion-implanting (FIG. 4(b)) an impurity such as boron. The collector region 13B may be formed by a similar step carried out for the base region. FIG. 4(c).

(3) Forming the first $SiO_2$ inter-layer insulation film 16. Successively, exposing the base layer 15 by forming an emitter electrode window hole 21EW through the inter-layer insulation film 16 using a general etching technique.

(4) Forming the polycrystalline silicon film 17 containing an impurity such as arsenic. This formation is carried out by first forming an impurity containing polycrystalline silicon film over the surface of the substrate; and second by removing all of this film except for the portion in, and in the vicinity of, the above-described emitter electrode window hole 21EW using a general patterning technique, for example, photolithography.

(5) Forming the emitter region 18 by diffusing an n+ type impurity arsenic from the impurity containing polycrystalline silicon film 17 into the base layer 15. FIG. 4(d).

(6) Depositing the second $SiO_2$ inter-layer insulation film 19 upon the entire surface of the semiconductor substrate, in order to insulate the impurity containing polycrystalline silicon film 17 from other portions.

(7) Depositing the third insulation film 20 comprising, for example, magnesium oxide (MgO), strontium titanate ($SrTiO_3$) or aluminum oxide ($Al_2O_3$) on the entire second insulation film 19.

(8) Depositing a superconductive film 21 as thick as, for example 600 nm, by means of, for example, magnetron sputtering method in which the target is a sintered mixture of barium, yttrium, copper oxide ($Ba_2YCu_{4.5}O_{8.5-y}$) as reported by Enomoto et al., Japanese Journal of Applied Physics, 26, L1248, 1987 which is hereby incorporated by reference.

(9) Heating the entire substrate in an oxygen containing atmosphere at, for example, approximately 920° C. for approximately 2 hours so that the deposited/patterned layers 21-E and 21-C become superconductive.

(10) Depositing a TEFLON-like polymer layer 22 upon the entire fabricated surface of the semiconductor substrate by, for example, RF (radio frequency) plasma deposition by means of $CHF_3$ (trifluoro methane) gas treatment. The deposited TEFLON-like polymer material is effective to passivate the device, and in particular the superconductive wiring layers 21-E and 21-C. FIG. 4(e).

(11) Patterning the deposited superconductive film 21 and the third insulation film 20 to form the wiring layer 21-E for the emitter electrode 24-E and the wiring layer 21-C for the collector electrode 4-C. The etching of the superconductive material can be performed with a lithography technique using 0.5% nitric acid ($HNO_3$) solution as reported by Enomoto et al., or by a reactive ion etching method using carbon tetrachloride ($CCl_4$) gas plasma. FIG. 4(f).

(12) Etching a part of the passivation film 22 and the superconductive wiring layer 21 respectively positioned above the collector electrode to form window hole 21CW and above the emitter electrode to form window hole 21EW, and a part of the third insulation film 20 positioned above the base region 15. The third insulation MgO film 20 may remain on the second insulation film 19.

(13) Etching a part of the second and first $SiO_2$ insulation films 19 and 16 so as to respectively form the base electrode window hole 21BW; and above the collector, the electrode window hole 21CW exposing the collector contact region 13B and the base region 15 respectively; and to form the emitter electrode window hole 21EW exposing the polycrystalline silicon film 17. FIG. 4(g).

(14) Depositing and patterning the TiN film 23 and the electrode 24-E and 24-C, and electrode/wiring 24-B each comprising a normal metal, such as aluminum. The film 23 fills the window holes 21BW, 21EW and 21CW and extends onto the surface of the TEFLON-like film 24. The aluminum on the TiN may be alternatively replaced by gold and tungsten on titanium.

(15) Deposition of a passivation film or insulation film that is commonly used for a multiple layer wiring structure may be additionally stacked thereon, if desired, for a particular application.

In the semiconductor device fabricated as described above, the superconductive ceramic material wirings do not touch the semiconductor region, i.e. the polycrystalline silicon film 17 or the collector contact region 13B. Therefore, copper atoms in the superconductive material never diffuse into the semiconductor region to form an alloy with silicon atoms therein; accordingly the problems of deteriorated performance and poor reliability of the device are avoided.

Moreover, the emitter electrode 24-B and the collector electrode 24-C including the TiN film 22 contact the superconductive layer side wall 21-E' and 21-C' respectively. Thus, the wiring layers provide superconductive conduction, even when the wiring layer is anisotropically superconductive mainly in the horizontal direction. Therefore, there is essentially no contact resistance between the superconductive wiring layers and the emitter/collector electrodes.

Operation of bipolar semiconductor devices generally degrades at low temperature. However, improvements in the operation of bipolar devices at temperatures as low as 77° K. have recently been achieved as reported by J.C.S. Woo et al., "Optimization of Bipolar Transistor for Low Temperature Operation," IEDM Technical Digest, pp. 401–404, 1987 and by J.M.C. Stock et al., "High Performance Operation of Silicon Bipolar Transistors at Liquid Nitrogen Temperature," IEDM Technical Digest pp. 405–408, 1987. The high current supply capability of bipolar transistors is ideally suitable for the use in combination with superconductive wirings to achieve high speed operation.

Another preferred embodiment of a MOSFET embodying the present invention is described with reference to FIGS. 6(a) and 6(b).

Figure 6A:
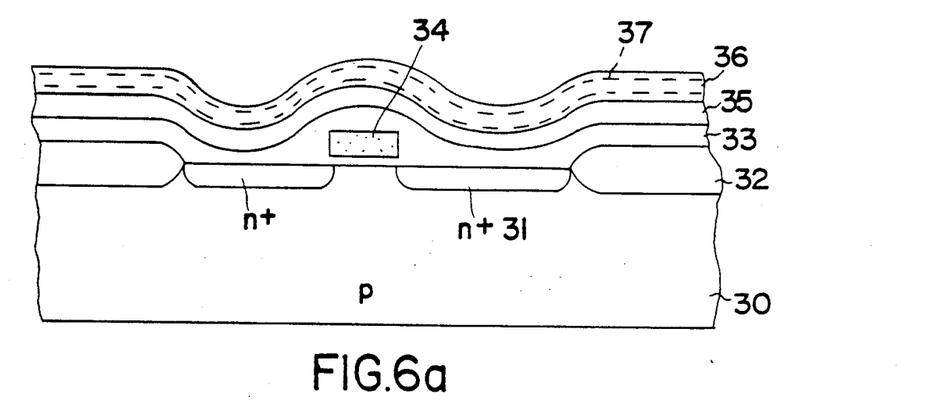
FIG. 6a is a schematic, cross-sectional view of a structure at an intermediate step in the fabrication of a MOSFET of FIG. 6b according to the present invention.
Figure 6B:
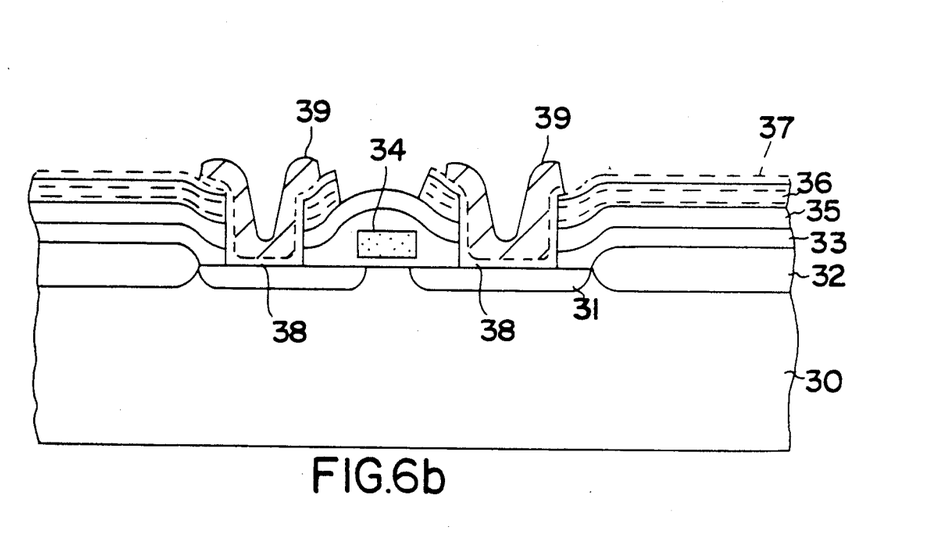
FIG. 6b is a schematic, cross-sectional view of a MOSFET according to the present invention.

The FIG. 6(a) structure is formed using widely used methods for fabricating MOSFET devices. More specifically, the following structural elements are formed before the formation of window holes: n+ regions 31 in a p-type substrate 30, $SiO_2$ field isolation 32, a 300 nm thick $SiO_2$ inter-layer insulation film 33, and a polycrystalline silicon gate 34. Next, MgO, which has a good lattice-affinity with the superconductive ceramic material, is deposited as thin as 20 nm on the $SiO_2$ film 33 by reactive sputtering of magnesium (Mg) in an oxygen atmosphere. Next, $Ba_2YCu_3O_{7-y}$ (barium-yttrium-copper oxide, referred to hereinafter as BYCO) 36 is deposited on the film 33 with magnetron sputtering method as reported by Enomoto. Next, the entire semiconductor substrate is heated, for example, at approximately 920° C. for approximately two hours. The BYCO layer 36 is etched to form a patterned wiring layer. Next, a TEFLON-like polymer film 37 is deposited on the patterned layer 36 as a passivation film, using an RF plasma deposition method.

Next, window holes are formed to expose the n+ region 31 through the passivation film 37, the BYCO film 36, the MgO film 35 and the inter-layer $SiO_2$ film 33. Next, the window holes are deposited with a metal 38. This metal is preferably a so-called barrier metal, comprising, for example, TiN. A normal metal, such as aluminum, is successively deposited to form the contact electrodes 39. The barrier metal 38 is not always necessary depending on the material of the electrode 39 and kind of the semiconductor material. Accordingly, copper atoms in the superconductive material do not react with Si in the semiconductor regions 31, while essentially zero contact resistance is achieved between the semiconductor region and the superconductive wiring.

Figure 7A:
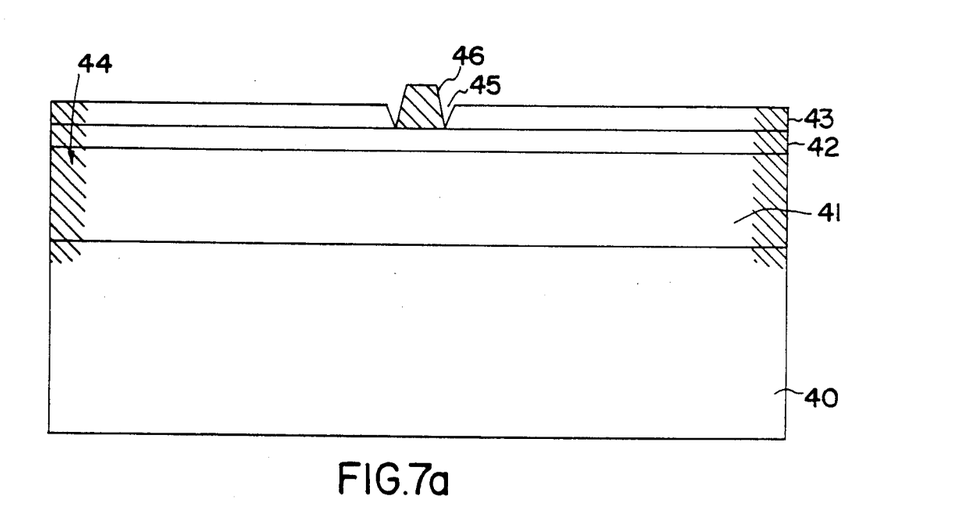
FIG. 7a is a schematic, cross-sectional side view of a structure at an intermediate step in the fabrication of a MESFET, and in particular, of a HEMT of FIG. 7d according to the present invention.

Still another preferred embodiment of a HEMT embodying the present invention is described with reference to FIGS. 7(a) thru 7(d). The processing steps upto the step of alloying a Au-Ge (gold-germanium) layer are well known individual steps. In other words, using a widely employed MBE method, an undoped, i.e. intrinsic, GaAs (gallium arsenide) layer 41 can be formed on a GaAs substrate 40, an n-type doped AlGaAs layer 42 is formed on layer 41, and an n-type GaAs layer 43 is formed on layer 42. Because MBE growth is used, these layers are continuously grown. Next, oxygen atoms are selectively ion-implanted, using any well known masking process, into a field region so as to form an isolation region 44. Only a portion 45, corresponding to a gate area, of the n-type GaAs layer 43 is selectively removed using a lithography technique. Tungsten silicide ($WSi_2$) is then deposited over the device using a sputtering method; and only a portion 46 of the $WSi_2$ deposition (a gate electrode), is left as a result of a lift-off method of removing portions of the $WSi_2$ layer. The device at this fabrication stage is shown in FIG. 7(a).

Figure 7B:
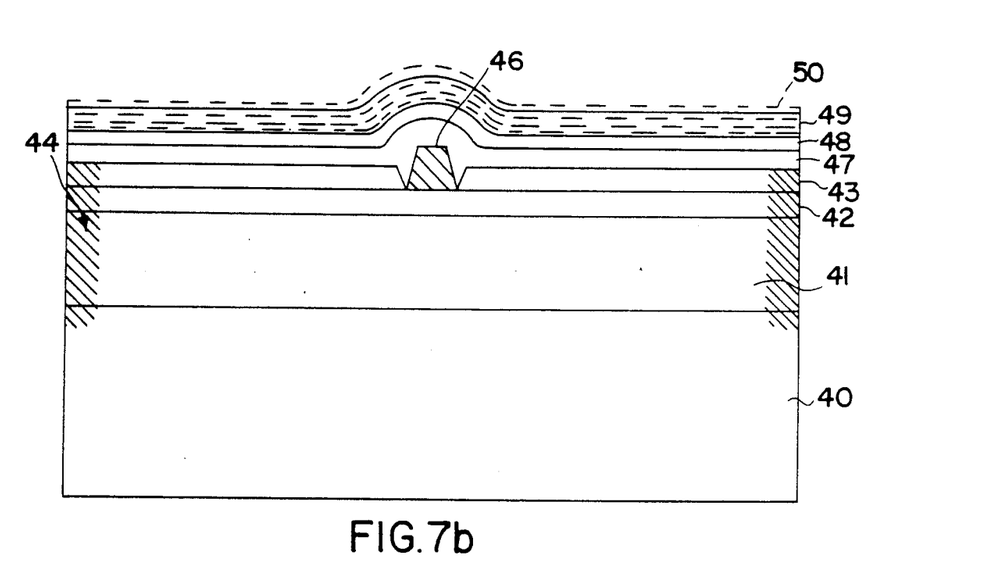
FIG. 7b is a schematic, cross-sectional side view of a structure at another intermediate step in the fabrication of the HEMT of FIG. 7d according to the present invention.

Next, a $SiO_2$ inter-layer insulation film 47 is deposited to a thickness of approximately 300 nm over the entire n-type GaAs layer 43 as well as over the gate electrode 46 by a general CVD (chemical vapor deposition) method. Next, the MgO film 48 and the BYCO superconductive layer 49 are deposited on the film 47 to form a multiple layer structure as shown in FIG. 7(b), using the same methods as described above for the MOSFET. The entire substrate is then heated in an atmosphere containing an oxygen gas at a temperature of, for example, 500° to 800° C., for approximately one hour so that the BYCO layer 49 becomes superconductive. Next, the superconductive layer 49 and the MgO layer 48 are pattern-etched. A TEFLON-like passivation film 50 is then deposited on the patterned surfaces by the same method as described above for the bipolar transistor. Next, a photoresist film is applied to the device. Portions of the photoresist defining the window holes are removed using any well known photo etching process. The window holes are then formed by etching the passivation film 50, the patterned superconductive layer 49, the MgO layer 48, and the $SiO_2$ insulation film 47. The windows expose areas for drain and source regions in the n-type GaAs layer 43. Next, Au-Ge (Au containing several percent of Ge) is deposited as thick as 3000 Å on the device. The unnecessary portions of the Au-Ge are then removed by removing the underlying photoresist, i.e. the widely used lift-off method, leaving each electrode 51.

Figure 7C:
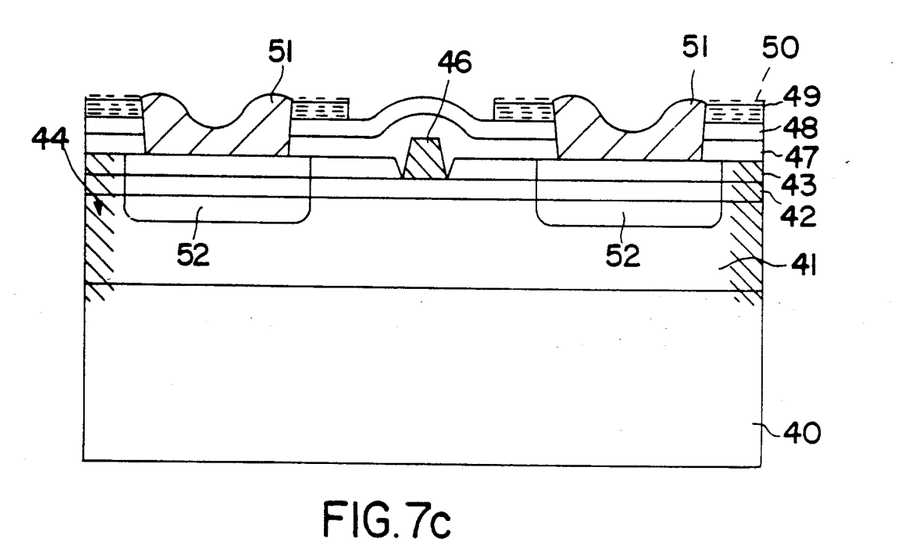
FIG. 7c is a schematic, cross-sectional side view of a structure at still another intermediate step in the fabrication of the HEMT of FIG. 7d according to the present invention.

The entire substrate is then heated at approximately 410° C. for several minutes so that the deposited Au-Ge 51 forms an alloy with the GaAs 43 and the AlGaAs 42. As a result, n+ type source and drain alloy regions 52 are formed.

Figure 7D:
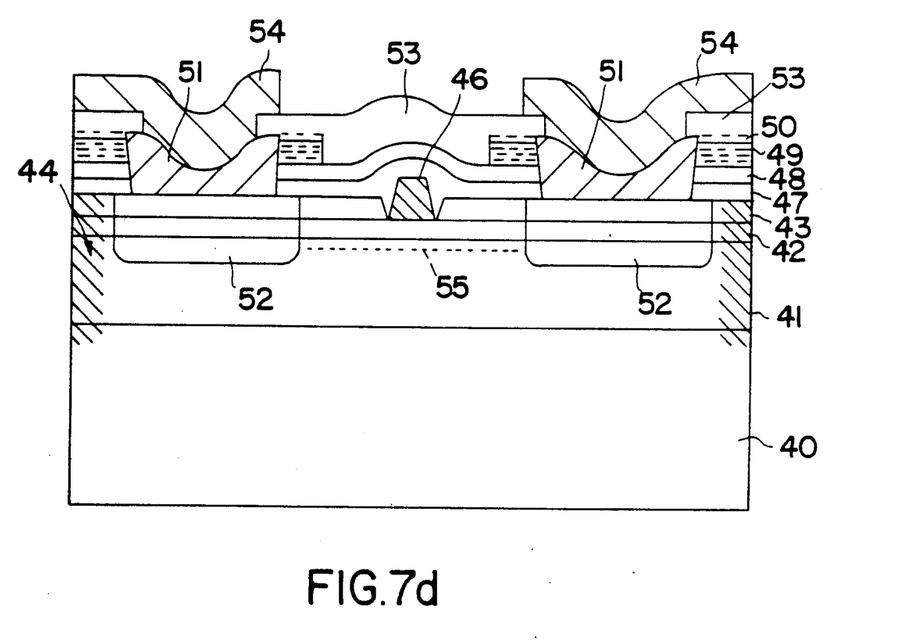
FIG. 7d is a schematic, cross-sectional side view of an HEMT according to the present invention.

Next, a second $SiO_2$ inter-layer insulation film 53 is deposited on the device using a generally well known deposition method. Next, the $SiO_2$ insulation film 53 is etched to form window holes for electrodes. The Ti-Pt-Au wiring layers 54 are then patterned on the $SiO_2$ insulation film 53, as shown in FIG. 7(d), so as to connect the electrodes 51 with each other or to a terminal for outside connection. A thin two-dimensional electron gas layer 55 is formed as shown by the dotted line in FIG. 7(d). This two-dimensional electron gas layer 55 acts as the channel for the HEMT.

In the embodiment of a HEMT as shown in FIG. 7, the AlGaAs layer 42 may be replaced with an n-GaAs layer having an impurity concentration of approximately $1 \times 10^{-17} cm^{-1}$ so as to fabricate a GaAs MESFET.

Employing the above process steps prevents a MESFET from being damaged by high temperature heat treatment processes. This is because the most temperature-sensitive parts of these devices are the Au-Ge alloyed source/drain regions, and these regions are formed after the heat treatment used to form the superconductive material by heating the material up to 500° to 800° C. If conventional wiring is simply replaced by a superconductive material without introducing the present invention, the high temperature heat process used to produce the superconductive property must be performed after the Au-Ge is deposited. This damages the GaAs and the AlGaAs regions. Thus, this configuration employing the present invention is beneficially advantageous, particularly in a HEMT or GaAs MESFET structure.

Figure 8A:
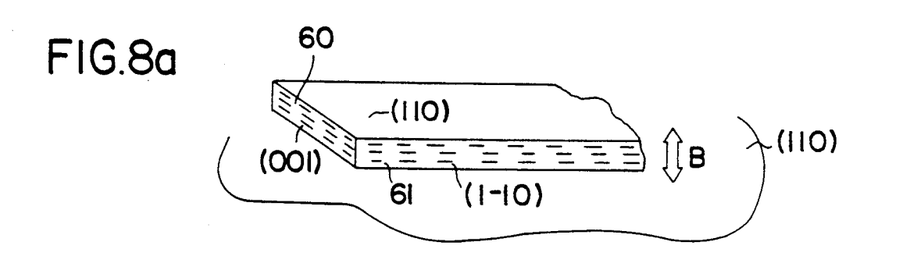
FIGS. 8(a)–8(c) are schematic views of various contact points with side-walls of a superconductive layer wiring.
Figure 8B:
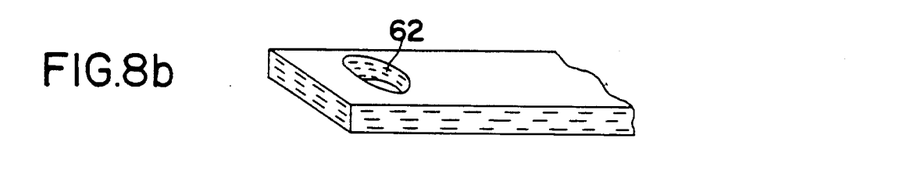
Figure 8C:
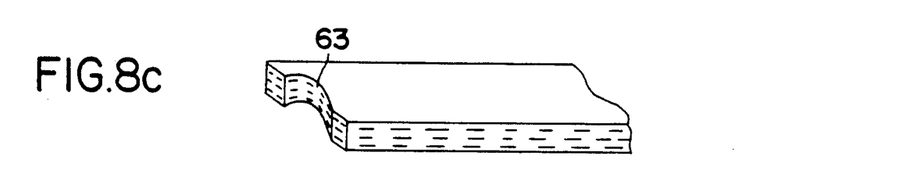

In the above-described embodiments, the electrodes 24, 39, or 51 comprise a normal metal such as aluminum, tungsten, gold or gold-germanium alloy, and contact the inner side-wall 62 of a window hole (FIG. 8(b)) in a superconductive layer directly or via a barrier metal such as TiN. The contact point can, however, be an end-wall 60 or a longitudinal side-wall 61 as shown in FIG. 8(a), or any other arbitrary shape of a side-wall 63 in FIG. 8(c). In each case the contact point is on a wall essentially orthogonal to the superconductive direction which is along the surface (1 1 0) in the figures, where the layer is anisotropically superconductive mainly along the direction of the surface (1 1 0) deposited upon the (1 1 0) surface of a substrate. In other words, the wall that a normal metal electrode must contact in order to benefit from a superconductive property of the layer wiring, when the wiring layer is anisotropically superconductive, is indicated by hatching in FIGS. 8(a) thru 8(c). While FIGS. 8(a) thru 8(c), show the hatched sides are drawn as being orthogonal to the (1 1 0) plane, these sides may be slanted as long as these sides contact the normal metal electrode.

In the preferred embodiment of FIGS. 4 and 5, the superconductive material is used as the emitter and collector wirings in which a relatively large current flows, while a normal metal is used for the base wiring. It is apparent that the superconductive material may be employed for any of the wirings on requirement.

While generally only one procedure is discussed with respect to fabricating the preferred embodiments, other methods can be employed, such as deposition, etching patterning and wiring in order to fabricate a structure embodying the present invention.

The many features and advantages of the invention are apparent from the detailed specification; and thus, it is intended by the appended claims to cover all such features and advantages of the system which fall within the true spirit and scope of the invention. Further, since numerous modifications and changes may readily occur to those skill in the art, it is not desired to limit the invention to the exact construction and operation shown and described, and accordingly, all suitable modifications and equivalents that may be resorted to, fall within the scope of the invention.

What is claimed is:

1. A semiconductor device comprising:
   a semiconductor substrate having a surface and including a plurality of semiconductor regions;
   an insulation film formed on said surface of semiconductor substrate;
   a superconductive wiring layer, having horizontal surface and a side-wall and being formed on said insulation film; and
   an electrode formed on one of said semiconductor regions and contacting said side-wall of said wiring layer.

2. A semiconductor device according to claim 1, wherein
   said superconductive wiring layer comprises a material that is anisotropically superconductive mainly in a direction parallel the surface of said substrate.

3. A semiconductor device according to claim 1, wherein said superconductive wiring layer has a hole with a side-wall, formed therein and said electrode contacts said superconductive wiring layer at the side-wall of the hole.

4. A semiconductor device according to claim 1, wherein said superconductive wiring layer comprises a metal oxide.

5. A semiconductor device according to claim 4, wherein said superconductive wiring layer comprises a copper oxide.

6. A semiconductor device according to claim 1, wherein said electrode includes a normal metal chosen from a group consisting of aluminum, gold, gold-germanium alloy, titanium and tungsten.

7. A semiconductor device according to claim 6, further comprising:
   a barrier metal layer positioned between said electrode and said superconductive wiring layer and between said electrode and said semiconductor region so as to prevent reaction of said normal metal with silicon in said semiconductor region and with said insulation layer.

8. A semiconductor device according to claim 7, wherein said barrier metal is chosen from a group consisting of titanium, molybdenum, and titanium nitride.

9. A semiconductor device according to claim 1, wherein said insulation film includes silicon dioxide comprising a magnesium oxide film thereon, said magnesium oxide film contacting said superconductive wiring layer.

10. A semiconductor device according to claim 9, further comprising a wiring layer formed of a normal metal.

11. A semiconductor device according to claim 1, wherein said electrode comprises a material different than said superconductive wiring layer.

12. A high electron mobility semiconductor device comprising:
    a semi-insulating substrate comprising a III-V family semiconductor compound;
    an undoped III-V family binary semiconductor compound layer positioned on said substrate;
    a doped III-V family ternary semiconductor compound layer positioned on said undoped layer;
    a doped III-V family binary semiconductor compound layer positioned on said ternary layer;
    a superconductive material layer being superconductive mainly in a first plane and having a side-wall; and
    an electrode contacting said side-wall and said doped III-V family binary semiconductor layer.

13. A high electron mobility semiconductor device according to claim 11, further comprising:
    a metal layer positioned between said electrode and said superconductive material layer.

14. A high electron mobility semiconductor device according to claim 11, further comprising an insulator layer positioned between said superconductor material layer and said doped III-V family binary semiconductor compound layer.

15. A high electron mobility semiconductor device according to claim 13, further comprising an insulator layer positioned between said superconductive material layer and said doped III-V family binary semiconductor compound layer.

16. A Metal Semiconductor FET (MESFET) device comprising:
    a semi-insulating substrate comprising a III-V family semiconductor compound;
    an n-type III-V family semiconductor compound layer positioned on said substrate;

a first doped III-V family binary semiconductor compound layer positioned on said undoped layer;

a second doped III-V family binary semiconductor compound positioned on said first binary layer;

a superconductive material layer positioned on the device being superconductive mainly in a first plane and having a sidewall; and an electrode contacting said side-wall and said doped III-V family binary semiconductor layer.

17. A MESFET device according to claim 15, further comprising:

a metal layer positioned between said electrode and said superconductive material layer.

18. A MESFET device according to claim 15, further comprising:

an insulator layer positioned between said superconductive material layer and said second doped III-V family binary semiconductor compound layer.

19. A MESFET device according to claim 17, further comprising:

an insulator layer positioned between said superconductive material layer and said second doped III-V family binary semiconductor compound layer.

* * * * *